United States Patent
Peón et al.

(12) 
(10) Patent No.: US 6,175,137 B1
(45) Date of Patent: Jan. 16, 2001

(54) MONOLITHIC RESISTOR HAVING DYNAMICALLY CONTROLLABLE IMPEDANCE AND METHOD OF MANUFACTURING THE SAME

(75) Inventors: Rogelio Peón, Gijon (ES); Maarten Visee, Houten (NL)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/363,781

(22) Filed: Jul. 29, 1999

(51) Int. Cl.$^7$ ............................ H01L 29/76; H01L 29/94; H01L 31/062; H01L 31/113; H01L 31/119

(52) U.S. Cl. ..................... 257/379; 257/537; 438/238

(58) Field of Search .................................. 257/379, 380, 257/536, 537; 438/238

(56) References Cited

U.S. PATENT DOCUMENTS

| | | | |
|---|---|---|---|
| 4,896,243 | * | 1/1990 | Chatterjee et al. ............... 362/91 |
| 5,491,357 | * | 2/1996 | Zambrano ........................... 257/337 |

* cited by examiner

*Primary Examiner*—Ngân V. Ngô

(57) ABSTRACT

A variable resistor, a method of manufacturing the same and a voltage bias circuit that incorporates at least one variable resistor. In one embodiment, the variable resistor includes: (1) a substrate including a doped region having an inherent resistance, (2) a controllable switch formed in the substrate, electrically coupled to the doped region and having a control terminal and (3) a controller, coupled to the control terminal, that toggles the controllable switch to modify a current flow through the doped region and thereby vary a resistance of the variable resistor.

21 Claims, 4 Drawing Sheets

MONOLITHIC RESISTOR HAVING DYNAMICALLY CONTROLLABLE IMPEDANCE AND METHOD OF MANUFACTURING THE SAME

TECHNICAL FIELD OF THE INVENTION

The present invention is directed, in general to integrated circuits and, more specifically, resistive elements and a method of tailoring a resistance of a monolithic resistor.

BACKGROUND OF THE INVENTION

The need for higher precision resistors in integrated circuits is increasing due to the demand for higher precision measurement and instrumentation circuitry. Additionally, many integrated circuits that employ both analog and digital circuit components together require close matching of resistors. Some of these cases also require that the resistors to be matched have high resistance values. The two requirements of precision and high resistance values are especially difficult to achieve simultaneously when only a small area is available in the semiconductor wafer.

Resistors can be implemented in several ways in integrated circuits. They can be constructed using metal, polysilicon, n+ diffusions, p+ diffusions or tub regions. For metal and polysilicon, the sheet resistance is typically low and adequate overall resistance matching may be achieved for lower values of resistance. However, adequate matching of larger resistance requires the use of a large area in the semiconductor wafer. For tub regions, the sheet resistance is typically high. Resistance matching is difficult, however, due to the fact that the sheet resistance is dependent on the value of tub to substrate voltage. For n+ diffusions and p+ diffusions, matching properties are typically intermediate to the cases discussed above, with high precision and large resistance values still being difficult to achieve. An additional problem arises in that only some of the resistance formulation techniques may be practical in any given semiconductor production process.

Semiconductor wafer "real estate" is of prime concern in the design and production of semiconductor circuits. As CMOS technology continues to allow gate sizes to shrink, the potential for an increase in circuit density and therefore the total number of semiconductor devices allowed per semiconductor circuit chip has increased dramatically. In devices and circuits where high component precision is usually not required, such as digital circuits, resistor area size is more easily managed. However, in many analog devices where resistor precision, large resistance values and even resistance matching are required, the resistor area required may be the controlling factor in determining device density. This situation may significantly reduce the device density otherwise achievable, and even make a device design marginally economical from a market perspective.

Accordingly, what is needed in the art is a way to readily provide small area, precision resistors that allow adequate resistance matching even for large resistance values.

SUMMARY OF THE INVENTION

To address the above-discussed deficiencies of the prior art, the present invention provides a variable resistor, a method of manufacturing the same and a voltage bias circuit that incorporates at least one variable resistor. In one embodiment, the variable resistor includes: (1) a substrate including a doped region having an inherent resistance, (2) a controllable switch formed in the substrate, electrically coupled to the doped region and having a control terminal and (3) a controller, coupled to the control terminal, that toggles the controllable switch to modify a current flow through the doped region and thereby vary a resistance of the variable resistor.

The present invention therefore introduces the broad concept of intermittently introducing a monolithic resistor into a given circuit to vary the effective resistance of the resistor. A large monolithic resistor, which may vary in resistance from its inherent value, may be "tuned" in this manner to adjust the resistance to the intended value.

In one embodiment of the present invention, the controllable switch is coupled in electrical series with the doped region, the controller decreasing a duty cycle of the controllable switch to decrease the current flow through the doped region and thereby increase a resistance of the variable resistor. In this embodiment, the resistance can only be adjusted upward.

In an alternative embodiment, the controllable switch is coupled in electrical parallel with the doped region, the controller increasing a duty cycle of the controllable switch to increase the current flow bypassing the doped region and thereby decrease a resistance of the variable resistor. In this embodiment, the resistance can only be adjusted downward.

In yet another alternative embodiment, two controllable switches are employed, one placed in series and another placed in parallel with the doped region. In this embodiment, the resistance can be adjusted either upward or downward, depending upon which of the two controllable switches is toggled.

In one embodiment of the present invention, the doped region is selected from the group consisting of: (1) a metal region, (2) a polysilicon region, (3) an n+ doped region, (4) a p+ doped region and (5) a region of tub material. Those skilled in the pertinent art are familiar with these conventional monolithic, fixed-value resistor structures. The present invention, however, is not limited in scope to these structures, and may employ any conventional or later-discovered structure in the doped region.

In one embodiment of the present invention, the variable resistor may have a resistance value that is tailored or matched to a resistance value of a second resistor. The second resistor may be another variable resistor. Alternately, the second resistor may be a fixed-value resistor or any other type of resistor.

In one embodiment of the present invention, the variable resistor may be used in a mixed signal circuit having both analog and digital elements. The variable resistor may be a component in one of the analog elements or be matched to a resistor in the analog elements. Of course, the variable resistor may have control circuits that are part of the digital elements or be a component used in the digital elements.

In one embodiment of the present invention, the controllable switch is a complementary metal oxide semiconductor (CMOS) switch. However, those skilled in the pertinent art will understand that the controllable switch may be any conventional or later-discovered semiconductor switch. The controller may also be formed in the substrate. This allows the entire variable resistor, including the controller, to be monolithic. Of course, this need not be the case; the controller may be discrete from the substrate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
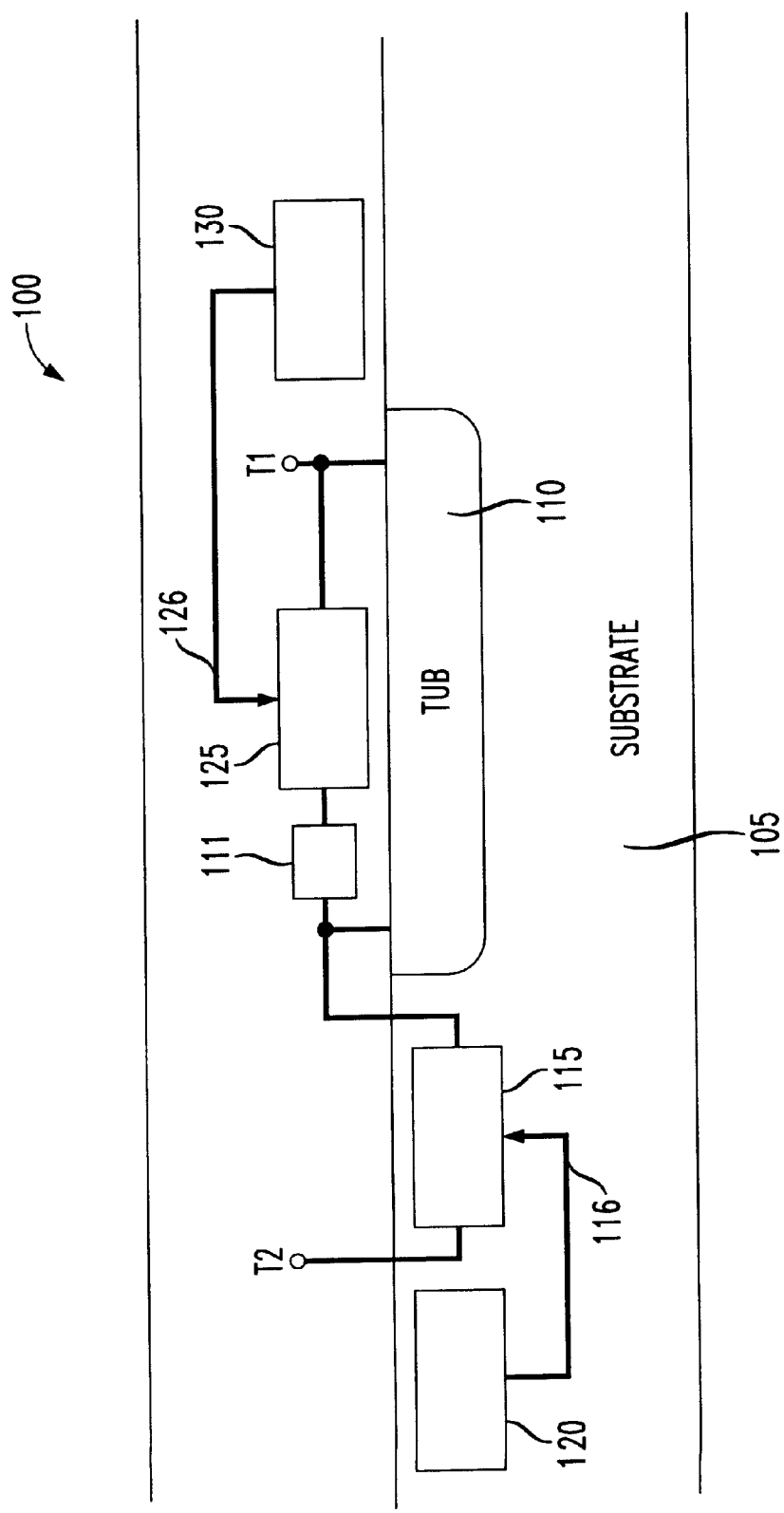
FIG. 1 illustrates a monolithic representation of a variable resistor showing an embodiment of the present invention.

Referring initially to FIG. 1, illustrated is a monolithic representation of a variable resistor 100 showing an embodiment of the present invention. The variable resistor 100 having terminals T1 and T2, comprises a resistor 110, a first controllable switch 115 with a control terminal 116. The variable resistor 100 further includes a first controller 120, coupled to the control terminal 116, that toggles the first controllable switch 115 to modify a current flow and thereby vary a resistance Rv of the variable resistor 100. The variable resistor 100 still further includes a second controllable switch 125 having a control terminal 126, and a second controller 130, coupled to the control terminal 126. The second controller 130 toggles the second controllable switch 125 in series with the resistor 111 to modify a current flow bypassing the resistor 110 and thereby also vary the resistance Rv of the variable resistor 100. All components are coupled to a substrate 105 in the case of an integrated circuit.

The present invention therefore introduces the broad concept of intermittently introducing a monolithic resistor into a given circuit to vary the effective resistance of the resistor. A monolithic resistor, which has an inherent value of resistance generally due to its size and construction, may be "tuned" or trimmed from the inherent value in this manner to adjust the effective resistance to the intended or chosen value.

In the embodiment shown, the doped region 110 is a region of tub material. Of course, the doped region 110 may also be selected from a group consisting of a metal region, a polysilicon region, an n+ doped region or a p+ doped region. Those skilled in the pertinent art are familiar with these conventional monolithic, fixed-value resistor structures. The present invention, however, is not limited in scope to these structures, and may employ any conventional or later-discovered structure in the doped region.

Figure 2:
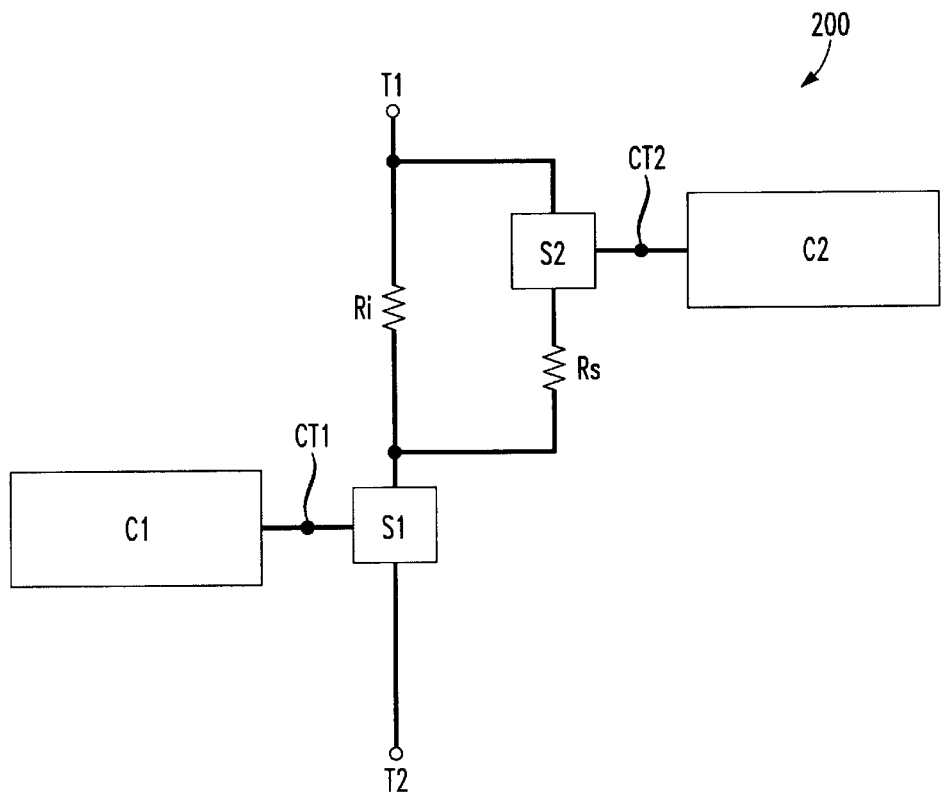
FIG. 2 illustrates a schematic representation of the variable resistor embodiment of FIG. 1.

Turning now to FIG. 2, illustrated is a schematic representation 200 of the variable resistor 100 embodiment shown in FIG. 1. The variable resistor 100 having terminals T1 and T2, includes an inherent resistance Ri, a first controllable switch S1, a second controllable switch S2 having a resistor Rs in series and first and second controllers C1, C2. The first and second controllers C1, C2 function to control the closing or conduction time of the first and second controllable switches S1, S2 respectively.

In this embodiment of the present invention, the first controllable switch S1 is coupled in electrical series with the inherent resistance Ri of the doped region 110. The first controller C1 may decrease a conduction duty cycle of the first controllable switch S1 to decrease the current flow through the doped region 110 and thereby increase a resistance Rv of the variable resistor 100 between the terminals T1 and T2. Alternately, the first controller C1 may increase the duty cycle of the first controllable switch S1 thereby increasing the current flow through the doped region 110 to provide a decrease in the resistance Rv of the variable resistor 100 between the terminals T1 and T2. The resistance Rv of the variable resistor 100 is directly proportional to the conduction time of the first controllable switch S1, since the effective resistance is a series average between the inherent resistance Ri during conduction and essentially an open circuit during non-conduction. In this case, the resistance Rv can only be adjusted upward from the inherent resistance Ri.

Additionally, the second controllable switch S2 is coupled in electrical parallel with the inherent resistance Ri of the doped region 110. In this case, the second controller C2 may increase a conduction duty cycle of the second controllable switch S2 to provide an increased current flow that bypasses the doped region 110 and thereby decrease the resistance Rv of the variable resistor 100. Alternately, the second controller C2 may decrease the conduction duty cycle of the second controllable switch S2 thereby decreasing the current flow that bypasses the doped region 110 to provide an increase in the resistance Rv of the variable resistor 100. In this case, the resistance Rv of the variable resistor 100 is inversely proportional to the conduction time of the second controllable switch S2, since the resistance Rv is a parallel average between the inherent resistance Ri during non-conduction and essentially a short circuit (the resistance Rs is normally small compared to the inherent resistance Ri) during conduction. In this case, the resistance Rv can only be adjusted downward from the inherent resistance Ri.

Thus, in this embodiment, two controllable switches are employed, one placed in series and another placed in parallel with the doped region 110. This allows the resistance Rv of the variable resistor 100 to be adjusted either upward or downward from the inherent resistance Ri, depending upon which of the two controllable switches is toggled. Of course, the variable resistor 100 may employ only one of the controllable switches S1 or S2 as the requirements may dictate. For the embodiment shown, use of only the first controllable switch S1 would require the second controllable switch S2 to be always open. Conversely, use of only the second controllable switch S2 would require that the first controllable switch S1 be always closed. The use of both first and second controllable switches S1, S2, however, may allow more sophisticated applications for the variable resistor to be employed, since the duty cycles of the first controllable switch S1 and the second controllable switch S2 may also be different.

The variable resistor 100 may have a value of the resistance Rv that is tailored or matched to a resistance value of a second resistor. The second resistor may be another variable resistor, a fixed-value resistor or any other type of resistor. Additionally, the variable resistor 100 may be used in a mixed signal circuit having both analog and digital elements. The variable resistor 100 may be a component in one of the analog elements or be matched to a resistor in the analog elements. Of course, the variable resistor may have control circuits that are part of the digital elements or be a component used in the digital elements.

In this embodiment, the controllable switches S1, S2 are complementary metal oxide semiconductor (CMOS) switches. However, those skilled in the pertinent art will understand that the controllable switches S1, S2 may be any conventional or later-discovered semiconductor switch. The controllers C1, C2 may also be formed in the substrate 105 as shown. This allows the entire variable resistor 100, including first and second controllers C1, C2, to be monolithic. Of course, this need not be the case; first and second controllers C1, C2 may be discrete from the substrate 105.

Figure 3:
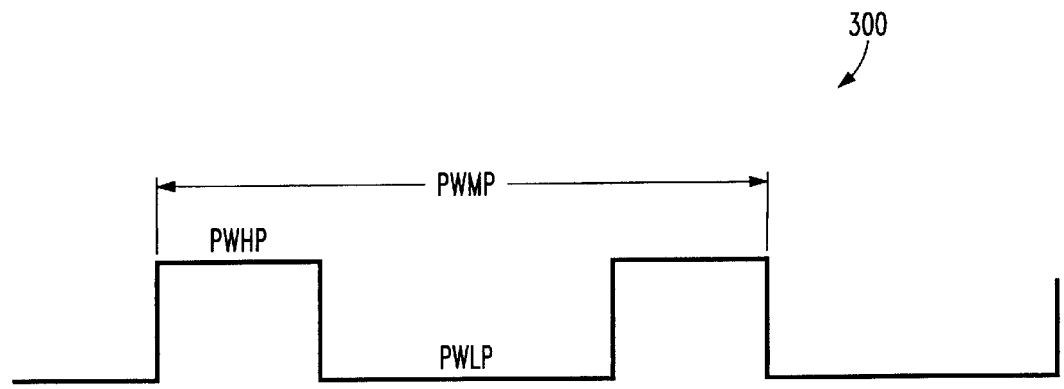
FIG. 3 illustrates a waveform showing a pulse width modulated control signal.

Turning now to FIG. 3, illustrated is a waveform showing a pulse width modulated (PWM) control signal 300. The PWM control signal 300 includes a pulse width high period (PWHP) and a pulse width low period (PWLP), which comprise a complete cycle with the sum of the PWHP and the PWLP always being one pulse width modulated period (PWMP). The PWM control signal 300 is typical of the waveform generated by the first and second controllers C1, C2 that is applied to the first and second controllable switches S1, S2 to determine their conduction duty cycle. The PWHP may have any value from zero to one, where zero means never conducting and one means always conducting for the controllable switches S1, S2. Of course, the PWLP would always complement these conditions, as shown.

The value of the resistance Rv for the variable resistor 100 is dependent on the PWM control signal 300 as previously discussed. For the case of a single series coupled controllable switch such as the first controllable switch S1 of FIG. 2, the resistance Rv may be expressed as:

$$Rv=Ri*(PWHP+PWLP)/PWHP.$$

If the quantity PWHP+PWLP is normalized to a value of one, then $$Rv=Ri/PWHP,$$

where the PWHP has a value between one and zero. Therefore, the resistance Rv is seen to be equal to the inherent resistance Ri for the PWHP equal to one. Additionally, the resistance Rv becomes an open circuit in the limit as the PWHP approaches zero. S2 should be OFF in this first control mode.

For the case of a single parallel coupled controllable switch such as the second controllable switch S2 of FIG. 2, the resistance Rv may be expressed as:

$$Rv=[Ri*Rs(PWHP+PWLP)]/[Ri*PWHP+Rs(PWHP+PWLP)],$$

where Rs is the resistance in series with the controllable switch S2. Again, if PWHP+PWLP is normalized to a value of one, then $$Rv=Ri*Rs/[Ri*PWHP+Rs],$$

where PWHP has a value between one and zero. Therefore, the resistance Rv is seen to be equal to the parallel combination of the inherent resistance Ri and the resistance Rs for the PWHP equal to one. Additionally, the resistance Rv becomes equal to the inherent resistance Ri for PWHP equal to zero. S2 should be OFF in this second control mode.

A combination of the previous control modes can also be implemented where we can develop a value of the resistance Rv for the variable resistor 100 where both first and second controllable switches S1, S2 have different duty cycles or even different PWMPs.

Figure 4:
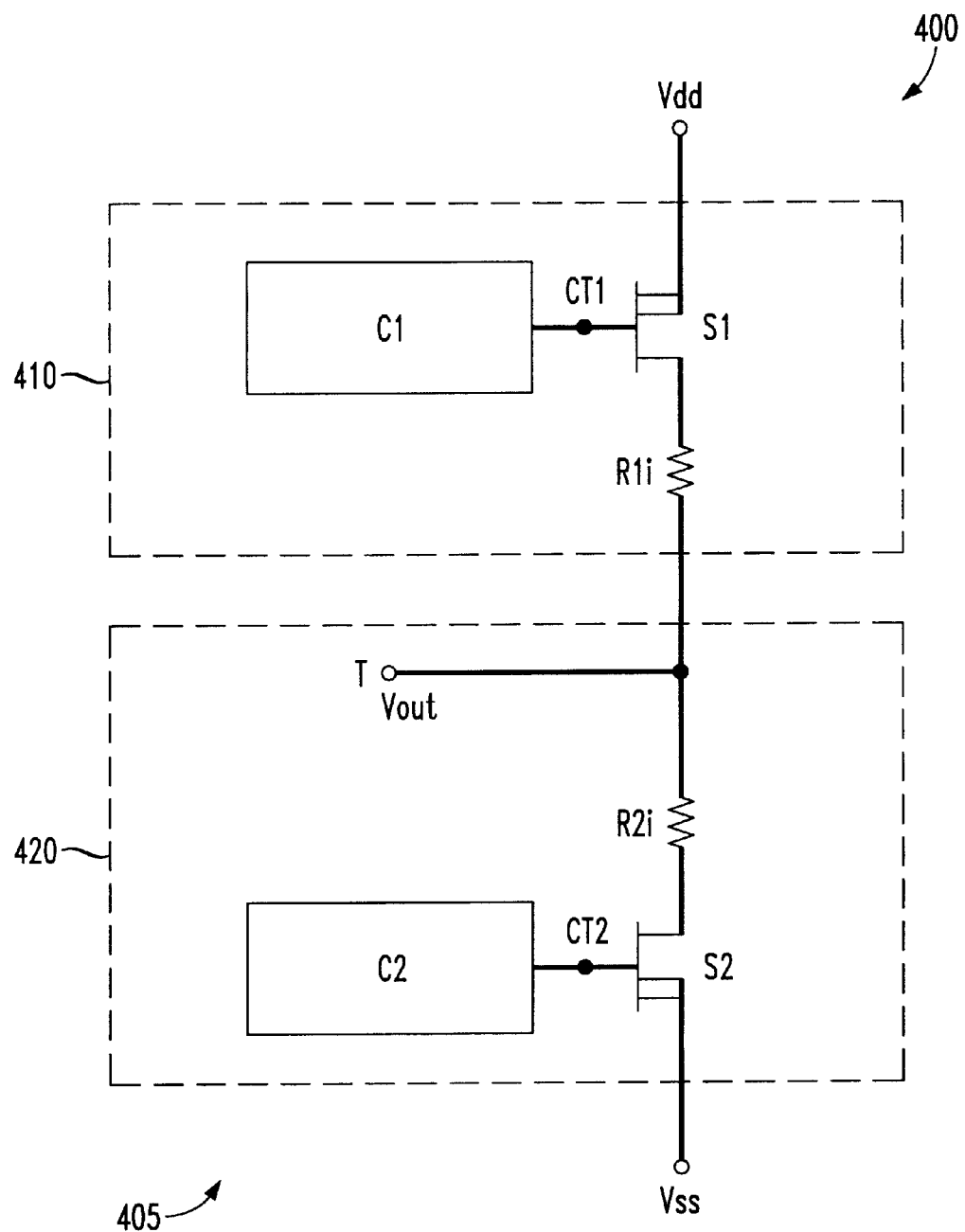
FIG. 4 illustrates a schematic of a voltage bias circuit constructed according to the principles of the present invention.

Turning now to FIG. 4, illustrated is a schematic of a voltage bias circuit 400 constructed according to the principles of the present invention. The voltage bias circuit 400 with an output terminal T, is shown in schematic form comprising a first variable resistor 410, incorporating a substrate 405 including a first doped region having a first inherent resistance R1$i$, a first controllable switch S1 having a first control terminal CT1 formed in the substrate 405 that is electrically coupled to the first doped region, and a first controller C1, coupled to the first control terminal CT1. The first control terminal CT1 toggles the first controllable switch S1 to modify a current flow through the first doped region and thereby vary a resistance R1$v$ of the first variable resistor 410.

The voltage bias circuit 400 further comprises a second variable resistor 420, coupled in electrical series with the first variable resistor 410 including a second doped region located in the substrate 405 having a second inherent resistance R2$i$, a second controllable switch S2 having a second control terminal CT2 formed in the substrate 405 that is electrically coupled to the second doped region, and a second controller C2, coupled to the second control terminal CT2. The second control terminal CT2 toggles the second controllable switch S2 to modify a current flow through the second doped region and thereby vary a resistance R2$v$ of the second variable resistor 420.

The output terminal T of the voltage bias circuit 400 is generally required to be biased to a certain output voltage Vout:

$$Vout=(Vdd-Vss)*R2v/(R1v+R2v)+Vss.$$

The output voltage Vout and the resistor divider output impedance can be adjusted using the duty cycle of the control signal.

Figure 5:
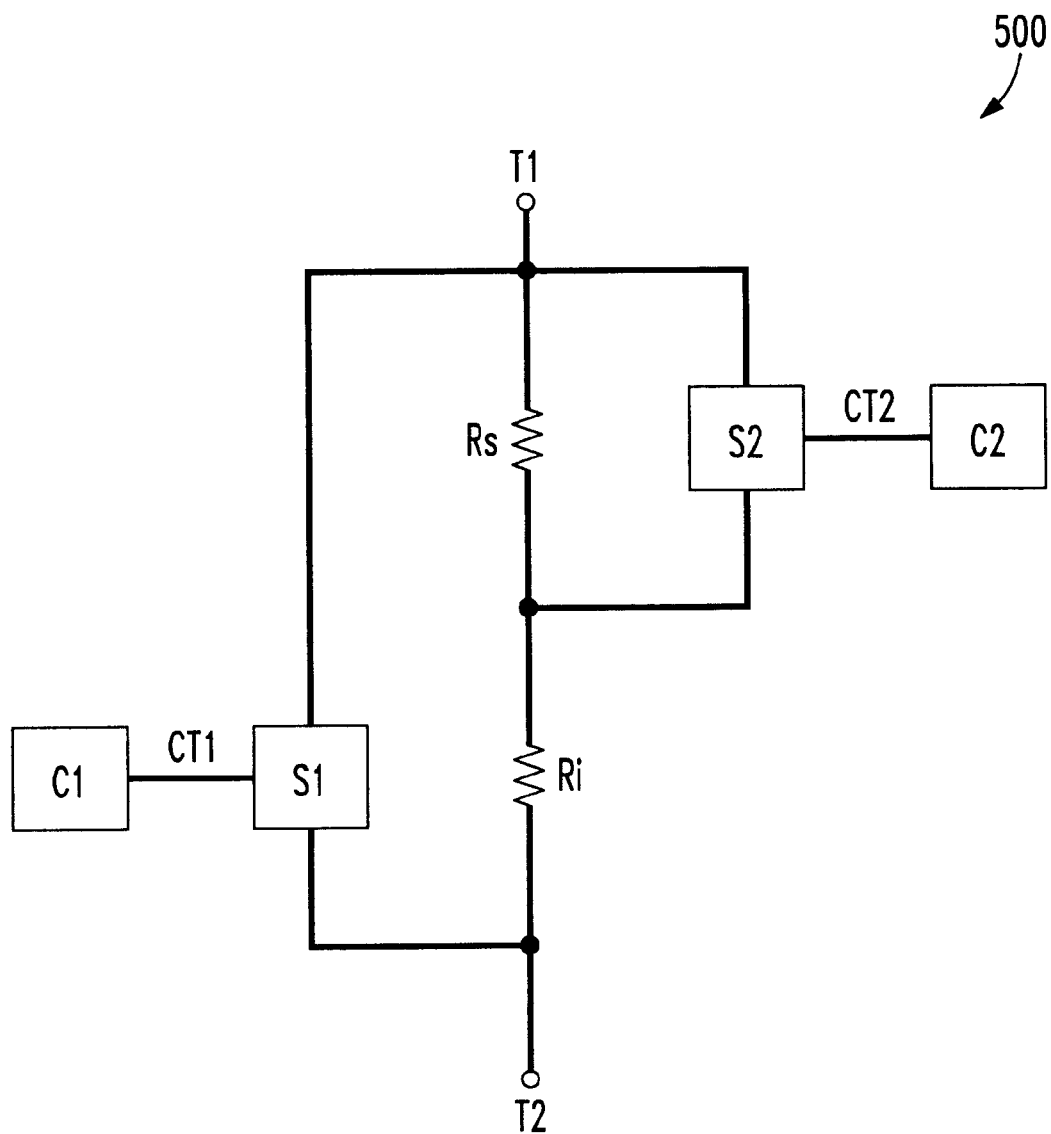
FIG. 5 illustrates an embodiment of a conductance controllable circuit employable in current-driven applications.

Turning now to FIG. 5, illustrated is an embodiment of a conductance controllable circuit 500 to be employed in applications wherein the circuit 500 is driven by currents. Electrically, the circuit 500 is comparable to the circuit 200 of FIG. 2.

From the above, it is apparent that the present invention provides a variable resistor, a method of manufacturing the same and a voltage bias circuit that incorporates at least one variable resistor. In one embodiment, the variable resistor includes: (1) a substrate including a doped region having an inherent resistance, (2) a controllable switch formed in the substrate, electrically coupled to the doped region and having a control terminal and (3) a controller, coupled to the control terminal, that toggles the controllable switch to modify a current flow through the doped region and thereby vary a resistance of the variable resistor.

Although the present invention has been described in detail, those skilled in the art should understand that they can make various changes, substitutions and alterations herein without departing from the spirit and scope of the invention in its broadest form.

What is claimed is:

1. A variable resistor, comprising:
   a substrate including a doped region having an inherent resistance;
   a controllable switch formed in said substrate, electrically coupled to said doped region and having a control terminal; and
   a controller, coupled to said control terminal, that toggles said controllable switch to modify a current flow through said variable resistor.

2. The variable resistor as recited in claim 1 wherein said controllable switch is coupled in electrical series with said doped region, said controller decreasing a duty cycle of said controllable switch to decrease said current flow through said doped region and thereby increase a resistance of said variable resistor.

3. The variable resistor as recited in claim 1 wherein said controllable switch is coupled in electrical parallel with said doped region, said controller increasing a duty cycle of said controllable switch to increase a current flow bypassing said doped region and thereby decrease a resistance of said variable resistor.

4. The variable resistor as recited in claim 1 wherein said doped region is selected from the group consisting of:
   a metal region,
   a polysilicon region,
   an n+ doped region,
   a p+ doped region, and
   a region of tub material.

5. The variable resistor as recited in claim 1 wherein a resistance value of said variable resistor is matched to a resistance value of a second resistor.

6. The variable resistor as recited in claim 1 wherein said variable resistor is used in a mixed signal circuit having both analog and digital elements.

7. The variable resistor as recited in claim 1 wherein said controllable switch is a complementary metal oxide semiconductor (CMOS) switch.

8. A method of manufacturing a variable resistor, comprising:
   forming a doped region having an inherent resistance in a substrate;
   forming a controllable switch in said substrate, said controllable switch electrically coupled to said doped region and having a control terminal; and
   coupling a controller to said control terminal, said controller capable of toggling said controllable switch to modify a current flow through said doped region and thereby vary a resistance of said variable resistor.

9. The method as recited in claim 8 wherein said coupling comprises coupling said controllable switch in electrical series with said doped region, said controller decreasing a duty cycle of said controllable switch to decrease said current flow through said doped region and thereby increase a resistance of said variable resistor.

10. The method as recited in claim 8 wherein said coupling comprises coupling said controllable switch in electrical parallel with said doped region, said controller increasing a duty cycle of said controllable switch to increase a current flow bypassing said doped region and thereby decrease a resistance of said variable resistor.

11. The method as recited in claim 8 wherein said doped region is selected from the group consisting of:
   a metal region,
   a polysilicon region,
   an n+ doped region,
   a p+ doped region, and
   a region of tub material.

12. The method as recited in claim 8 wherein a resistance value of said variable resistor is matched to a resistance value of a second resistor.

13. The method as recited in claim 8 wherein said variable resistor is used in a mixed signal circuit having both analog and digital elements.

14. The method as recited in claim 8 wherein said controllable switch is a complementary metal oxide semiconductor (CMOS) switch.

15. A voltage bias circuit, comprising:
   a first variable resistor, including:
      a substrate including a first doped region having an inherent resistance,
      a first controllable switch formed in said substrate, electrically coupled to said first doped region and having a first control terminal, and
      a first controller, coupled to said first control terminal, that toggles said first controllable switch to modify a current flow through said first doped region and thereby vary a resistance of said first variable resistor; and a second variable resistor, coupled in electrical series with said first variable resistor and including:
      a second doped region located in said substrate and having an inherent resistance,
      a second controllable switch formed in said substrate, electrically coupled to said second doped region and having a second control terminal, and
      a second controller, coupled to said second control terminal, that toggles said second controllable switch to modify a current flow through said second doped region and thereby vary a resistance of said second variable resistor.

16. The voltage bias circuit as recited in claim 15 wherein said first controllable switch is coupled in electrical series with said first doped region, said first controller decreasing a duty cycle of said first controllable switch to decrease said current flow through said first doped region and thereby increase a resistance of said first variable resistor.

17. The voltage bias circuit as recited in claim 15 wherein said first controllable switch is coupled in electrical parallel with said first doped region, said first controller increasing a duty cycle of said first controllable switch to increase a current flow bypassing said first doped region and thereby decrease a resistance of said first variable resistor.

18. The voltage bias circuit as recited in claim 15 wherein said first doped region is selected from the group consisting of:
   a metal region,
   a polysilicon region,
   an n+ doped region,
   a p+ doped region, and
   a region of tub material.

19. The voltage bias circuit as recited in claim 15 wherein a resistance value of said variable resistor is matched to a resistance value of a second resistor.

20. The voltage bias circuit as recited in claim 15 wherein said variable resistor is used in a mixed signal circuit having both analog and digital elements.

21. The voltage bias circuit as recited in claim 15 wherein said first controllable switch is a complementary metal oxide semiconductor (CMOS) switch.

* * * * *